(12) United States Patent
Komatsu et al.

(10) Patent No.: US 10,903,101 B2
(45) Date of Patent: Jan. 26, 2021

(54) SUBSTRATE PROCESSING APPARATUS AND METHOD FOR DETECTING ABNORMALITY OF SUBSTRATE

(71) Applicant: EBARA CORPORATION, Tokyo (JP)

(72) Inventors: Mitsunori Komatsu, Tokyo (JP); Toru Maruyama, Tokyo (JP); Yoshinori Isono, Tokyo (JP); Hiroaki Yanagi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 682 days.

(21) Appl. No.: 15/132,928

(22) Filed: Apr. 19, 2016

(65) Prior Publication Data

US 2016/0315002 A1    Oct. 27, 2016

(30) Foreign Application Priority Data

Apr. 23, 2015    (JP) .................................. 2015-088696

(51) Int. Cl.
*H01L 21/67* (2006.01)
*B24B 37/005* (2012.01)
(Continued)

(52) U.S. Cl.
CPC .... *H01L 21/67288* (2013.01); *B24B 37/0053* (2013.01); *B24B 37/345* (2013.01); *H01L 21/67219* (2013.01); *H01L 22/12* (2013.01)

(58) Field of Classification Search
None
See application file for complete search history.

(56) References Cited

U.S. PATENT DOCUMENTS 7,083,706 B2 *   8/2006   Kumekawa ....... H01L 21/67051
                                                                204/198
2004/0246476 A1   12/2004   Bevis et al.
(Continued)

FOREIGN PATENT DOCUMENTS

CN    103029042 A    4/2013
JP    07-335596 A    12/1995
(Continued)

OTHER PUBLICATIONS

Machine Generated English Translation the Description of JP2006035328. Published Feb. 9, 2006. (Year: 2006).*
(Continued)

*Primary Examiner* — Sylvia MacArthur
(74) *Attorney, Agent, or Firm* — BakerHostetler

(57) ABSTRACT

A substrate processing apparatus having a detecting unit that can detect an abnormality of a substrate such as a crack of the substrate or chipping of the substrate is disclosed. The substrate processing apparatus includes a polishing unit configured to polish a substrate, a cleaning unit configured to clean the polished substrate, a substrate abnormality detection unit configured to detect an abnormality of the substrate, and a substrate transporting mechanism configured to transport the substrate in the order of the polishing unit, the substrate abnormality detection unit, and the cleaning unit. The substrate abnormality detection unit includes an imaging device configured to image the substrate, and an output monitoring unit configured to determine a status of the substrate by comparing a signal obtained from the imaging device with a predetermined threshold.

18 Claims, 8 Drawing Sheets

(51) Int. Cl.
*B24B 37/34* (2012.01)
*H01L 21/66* (2006.01)
*H01L 21/687* (2006.01)

(56) References Cited

U.S. PATENT DOCUMENTS

| | | | |
|---|---|---|---|
| 2008/0200100 A1* | 8/2008 | Takahashi | B24B 9/065 451/44 |
| 2008/0274670 A1 | 11/2008 | Tada et al. | |
| 2010/0035516 A1 | 2/2010 | Takahashi et al. | |
| 2013/0179094 A1* | 7/2013 | Valley | G06T 7/0002 702/40 |
| 2015/0017745 A1 | 1/2015 | Kimba et al. | |
| 2015/0101752 A1* | 4/2015 | Tada | B24B 9/065 156/345.13 |
| 2016/0315002 A1* | 10/2016 | Komatsu | H01L 21/67288 |

FOREIGN PATENT DOCUMENTS

| | | |
|---|---|---|
| JP | 2002-261146 A | 9/2002 |
| JP | 2005-294378 A | 10/2005 |
| JP | 2006-035328 A | 2/2006 |
| JP | 2008-500907 A | 1/2008 |
| JP | 2008-155292 A | 7/2008 |
| JP | 2010-050436 A | 3/2010 |
| JP | 2012-019216 A | 1/2012 |
| JP | 2013-082055 A | 5/2013 |
| JP | 2014-172161 A | 9/2014 |
| JP | 2015-035595 A | 2/2015 |
| KR | 1999-0009659 A | 2/1999 |
| KR | 2005-0050189 A | 5/2005 |
| KR | 1575895 B1 * | 12/2015 |
| TW | 201509599 A | 3/2015 |
| WO | WO 2005/115689 A1 | 12/2005 |
| WO | WO 2014/119124 A1 | 8/2014 |

OTHER PUBLICATIONS

Machine Generated English Translation the Claims of JP2006035328. Published Feb. 9, 2006. (Year: 2006).*
Singapore Patent Application No. 10201603136Q; Search Report; dated Jul. 6, 2018; 4 pages.

* cited by examiner

*FIG. 4A*
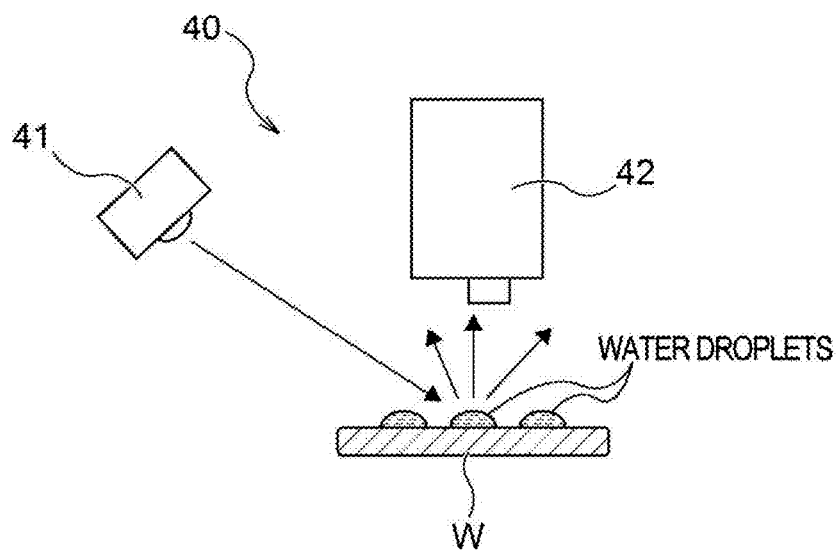
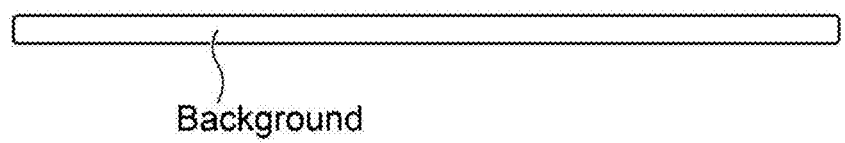
*FIG. 4B*

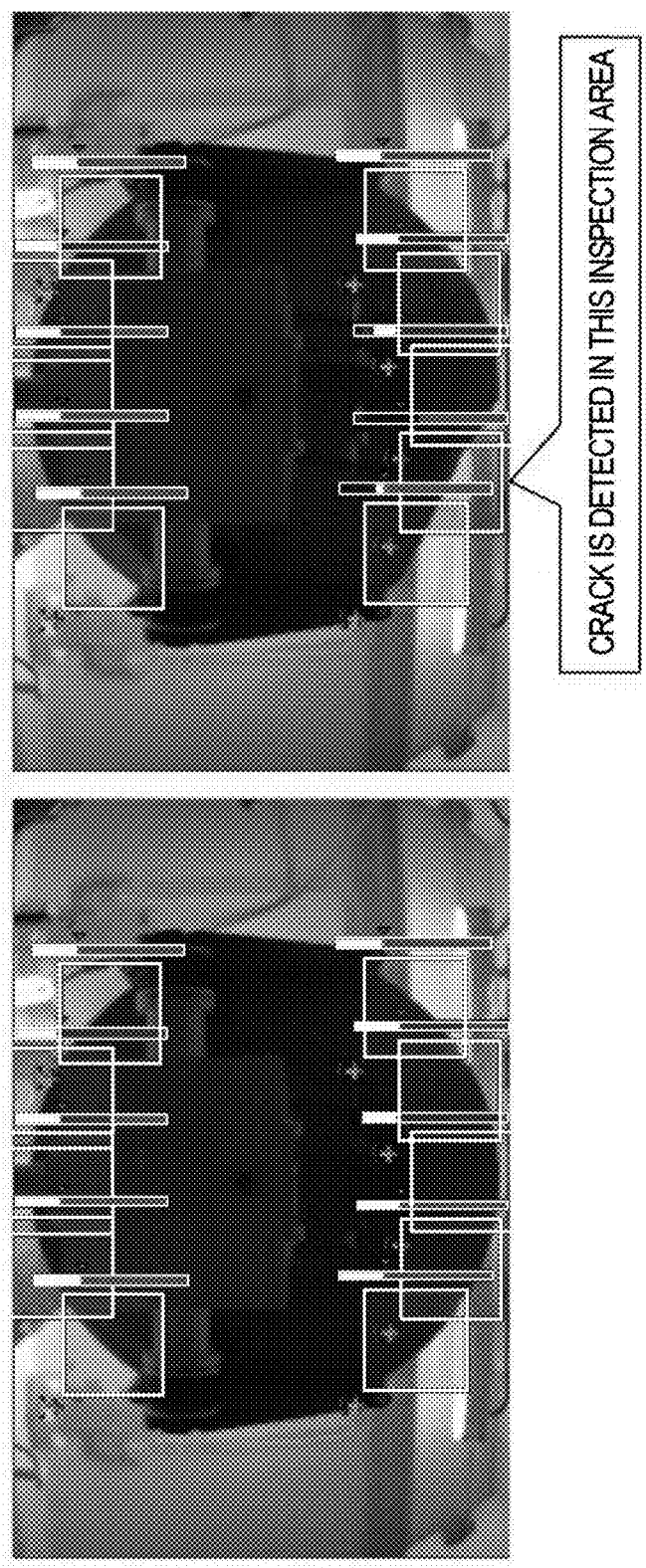

SUBSTRATE PROCESSING APPARATUS AND METHOD FOR DETECTING ABNORMALITY OF SUBSTRATE

CROSS REFERENCE TO RELATED APPLICATION

This document claims priority to Japanese Patent Application Number 2015-088696 filed Apr. 23, 2015, the entire contents of which are hereby incorporated by reference.

BACKGROUND

In recent years, high integration and high density in semiconductor device demands smaller and smaller wiring patterns or interconnections and also more and more interconnection layers. Multilayer interconnections in smaller circuits result in greater steps which reflect surface irregularities on lower interconnection layers. An increase in the number of interconnection layers makes film coating performance (step coverage) poor over stepped configurations of thin films. Therefore, better multilayer interconnections need to have the improved step coverage and proper surface planarization. Further, since the depth of focus of a photolithographic optical system is smaller with miniaturization of a photolithographic process, a surface of the semiconductor device needs to be planarized such that irregular steps on the surface of the semiconductor device will fall within the depth of focus.

Thus, in a manufacturing process of a semiconductor device, it increasingly becomes important to planarize a surface of the semiconductor device. One of the most important planarizing technologies is chemical mechanical polishing (CMP). In the chemical mechanical polishing, using a substrate processing apparatus, while a polishing liquid containing abrasive particles such as silica ($SiO_2$) or ceria ($CeO_2$) therein is supplied onto a polishing pad, a wafer is brought into sliding contact with the polishing pad, so that the wafer is polished.

The substrate processing apparatus which performs the above-mentioned CMP process includes a polishing unit comprising a polishing table having a polishing pad and a top ring for holding a wafer (substrate). The polishing table and the top ring are respectively configured to be rotatable. While the polishing table and the top ring are being rotated, a polishing liquid (slurry) is supplied onto the polishing pad. In this state, the wafer is pressed against the polishing pad by the top ring, so that the wafer is polished in the presence of the polishing liquid between the wafer and the polishing pad. The polished wafer is transported to a cleaning unit by a transporting mechanism, and is then cleaned and dried in the cleaning unit.

In the polishing unit, when the polished wafer is raised from the polishing pad or the polished wafer is released from the top ring, the wafer may be cracked. The above-mentioned transporting mechanism is provided with an optical sensor to detect whether the wafer is present on a wafer transfer stage of the transporting mechanism. However, such crack of the wafer cannot be detected unless the optical axis of the optical sensor passes through the cracked portion of the wafer.

If a partially damaged wafer is transported to the cleaning unit with its defect undetected, the wafer may be broken into pieces when wafer cleaning is performed in the cleaning unit. If the wafer is broken into pieces, the broken pieces of the wafer are attached to a cleaning member, such as a roll sponge, arranged in the cleaning unit to cause damage to the cleaning member. Further, such cleaning member needs to be replaced, thus increasing the running cost of the substrate processing apparatus.

Furthermore, if the wafer is cleaned by using the cleaning member with the broken pieces attached, the wafer is not only contaminated but also scratched. Therefore, if the wafer is broken into pieces, it is necessary that the operation of the substrate processing apparatus is stopped and the interior of the substrate processing apparatus is sufficiently cleaned to collect all the broken wafer pieces scattered in the substrate processing apparatus. However, such cleaning work requires an extremely long time, thus increasing downtime of the substrate processing apparatus.

SUMMARY OF THE INVENTION

According to an embodiment, there is provided a substrate processing apparatus having a detecting unit that can detect an abnormality of a substrate such as a crack of the substrate or chipping of the substrate. Further, according to another embodiment, there is provided a method for detecting an abnormality of the substrate such as a crack of the substrate.

Embodiments, which will be described below, relate to a substrate processing apparatus for processing a substrate such as a wafer, and more particularly to a substrate processing apparatus having a function for detecting an abnormality of the substrate such as a crack of the substrate or chipping of the substrate. Further, embodiments relate to a method for detecting an abnormality of the substrate such as a crack of the substrate.

In an embodiment, there is provided a substrate processing apparatus comprising: a polishing unit configured to polish a substrate; a cleaning unit configured to clean the polished substrate; a substrate abnormality detection unit configured to detect an abnormality of the substrate; and a substrate transporting mechanism configured to transport the substrate in the order of the polishing unit, the substrate abnormality detection unit, and the cleaning unit; the substrate abnormality detection unit comprising: an imaging device configured to image the substrate; and an output monitoring unit configured to determine a status of the substrate by comparing a signal obtained from the imaging device with a predetermined threshold.

In an embodiment, there is provided a substrate processing apparatus comprising: a processing unit configured to process a substrate; a substrate transporting mechanism configured to transport the substrate; a substrate abnormality detection unit configured to detect an abnormality of the substrate; and the substrate abnormality detection unit comprising: an imaging device configured to image the substrate; and an output monitoring unit configured to determine a status of the substrate by comparing a signal obtained from the imaging device with a predetermined threshold.

In an embodiment, the signal obtained from the imaging device comprises a signal obtained from each of a plurality of areas, each of the plurality of areas including a part corresponding to the substrate and a part corresponding a background; and the output monitoring unit determines the abnormality of the substrate when the signal obtained from at least one of the plurality of areas falls outside the threshold.

In an embodiment, the imaging device comprises a camera with a built-in CMOS sensor.

In an embodiment, the substrate transporting mechanism comprises a moving mechanism configured to move the substrate; when the abnormality of the substrate is detected by the output monitoring unit of the substrate abnormality detection unit, a predetermined operation of the moving mechanism and re-detection operation of the substrate abnormality detection unit are performed at least one time; and the abnormality of the substrate is determined when the abnormality of the substrate is detected consecutively by the re-detection operation.

In an embodiment, the moving mechanism comprises chucks configured to support a peripheral portion of the substrate, and moves the chucks and the substrate in a state where a predetermined clearance is formed between each of the chucks and the peripheral portion of the substrate.

In an embodiment, the predetermined operation of the moving mechanism comprises lifting/lowering, and one of reversing, rotation about a horizontal axis and rotation about a vertical axis.

In an embodiment, the substrate abnormality detection unit comprises a light source.

In an embodiment, the light source comprises a light source configured to emit light of an infrared region.

In an embodiment, the substrate is located between the imaging device and the light source, and at the time of imaging, the light source emits the light to an area which is to be a background of the substrate.

In an embodiment, the light source is turned on during a limited time of imaging by the imaging device.

In an embodiment, a liquid film is formed on a surface of the substrate immediately before the imaging of the substrate.

In an embodiment, the abnormality of the substrate is a crack of the substrate.

In an embodiment, there is provided a method for detecting an abnormality of a substrate, comprising: imaging the substrate by a camera; setting a plurality of inspection areas from the obtained image, each of the inspection areas extending over an image part corresponding to the substrate and an image part corresponding to a background; and comparing a value obtained from the image part corresponding to the substrate and the image part corresponding to the background with a predetermined threshold in each of the plurality of inspection areas to determine a status of the substrate.

According to the above-described embodiments, after a substrate is polished, an abnormality of the substrate such as a crack of the substrate or chipping of the substrate can be detected. Further, since the abnormality of the substrate such as a crack of the substrate is detected before the substrate is transported to the cleaning unit, the substrate can be prevented from being broken into pieces in the cleaning unit. Therefore, damage of associated parts and an increase of time for restoration work such as cleaning work caused by the shattered substrate (secondary break) can be avoided. Further, the above-described embodiments are effective also in preventing secondary damage such as a scratch of the substrate or a crack of another substrate caused by insufficient cleaning.

BRIEF DESCRIPTION OF THE DRAWINGS

FIG. 4A is a schematic view showing a configuration of a substrate abnormality detection unit which has been used in the evaluation experiment 1, and FIG. 4B shows an image taken by a camera shown in FIG. 4A;

FIGS. 7A and 7B are views showing a detecting method for detecting a crack of a wafer from an image taken by the camera of the substrate abnormality detection unit configured as shown in FIG. 3, and FIG. 7A shows the case of a normal wafer and FIG. 7B shows the case of a cracked or broken wafer.

DESCRIPTION OF EMBODIMENTS

Figure 1:
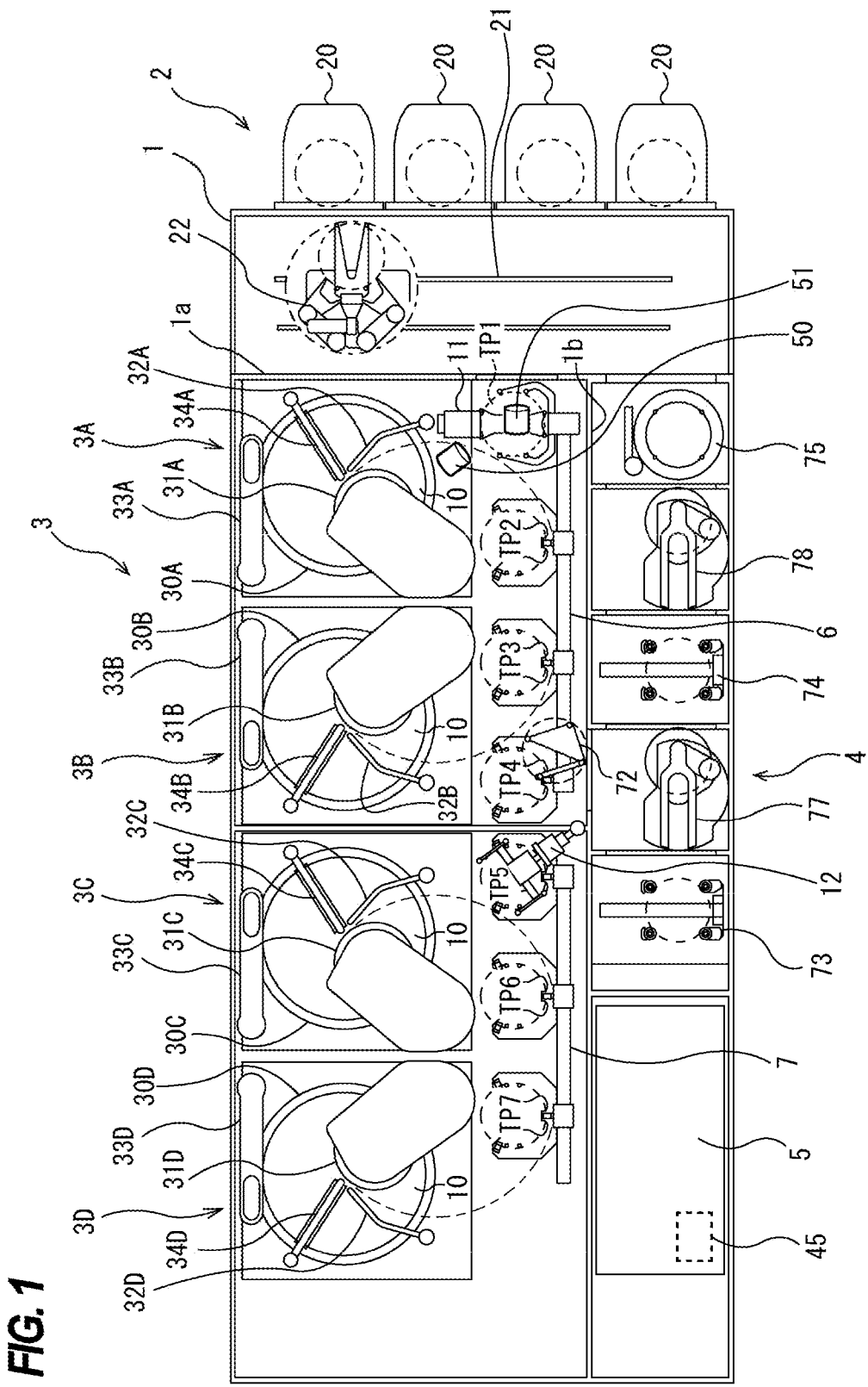
FIG. 1 is a plan view showing an arrangement of a substrate processing apparatus according to an embodiment.

A substrate processing apparatus according to an embodiment will be described below with reference to FIGS. 1 through 8. Like or corresponding parts are denoted by like or corresponding reference numerals in FIGS. 1 through 8 and will not be described below repetitively.

FIG. 1 is a plan view showing an arrangement of a substrate processing apparatus according to an embodiment. The substrate processing apparatus is a composite apparatus which can polish a substrate such as a wafer, clean the polished substrate, and dry the cleaned substrate. As shown in FIG. 1, the substrate processing apparatus has a housing 1 in a rectangular form. An interior space of the housing 1 is divided into a loading/unloading section 2, a polishing section 3, and a cleaning section 4 by partition walls 1a and 1b. The substrate processing apparatus further includes an operation controller 5 for controlling wafer processing operations.

The loading/unloading section 2 has front loading units 20 on which substrate cassettes, each storing plural wafers (substrates), are placed. The loading/unloading section 2 has a moving mechanism 21 extending along an arrangement direction of the front loading units 20. A transfer robot (loader) 22 is installed on the moving mechanism 21 and is movable along the arrangement direction of the substrate cassettes. The transfer robot 22 is configured to move on the moving mechanism 21 so as to access the substrate cassettes mounted on the front loading units 20.

The polishing section 3 is an area where a wafer is polished. This polishing section 3 includes a first polishing unit 3A, a second polishing unit 3B, a third polishing unit 3C, and a fourth polishing unit 3D. As shown in FIG. 1, the first polishing unit 3A includes a first polishing table 30A to which a polishing pad 10 having a polishing surface is attached, a first top ring 31A for holding a wafer and pressing the wafer against the polishing pad 10 on the polishing table 30A to polish the wafer, a first polishing liquid supply nozzle 32A for supplying a polishing liquid (e.g., slurry) and a dressing liquid (e.g., pure water) onto the polishing pad 10, a first dresser 33A for dressing the polishing surface of the polishing pad 10, and a first atomizer 34A for ejecting a mixed fluid of a liquid (e.g., pure water) and a gas (e.g., nitrogen gas) in an atomized state onto the polishing surface of the polishing pad 10.

Similarly, the second polishing unit 3B includes a second polishing table 30B to which a polishing pad 10 is attached, a second top ring 31B, a second polishing liquid supply nozzle 32B, a second dresser 33B, and a second atomizer 34B. The third polishing unit 3C includes a third polishing table 30C to which a polishing pad 10 is attached, a third top ring 31C, a third polishing liquid supply nozzle 32C, a third dresser 33C, and a third atomizer 34C. The fourth polishing unit 3D includes a fourth polishing table 30D to which a polishing pad 10 is attached, a fourth top ring 31D, a fourth polishing liquid supply nozzle 32D, a fourth dresser 33D, and a fourth atomizer 34D.

Figure 2:
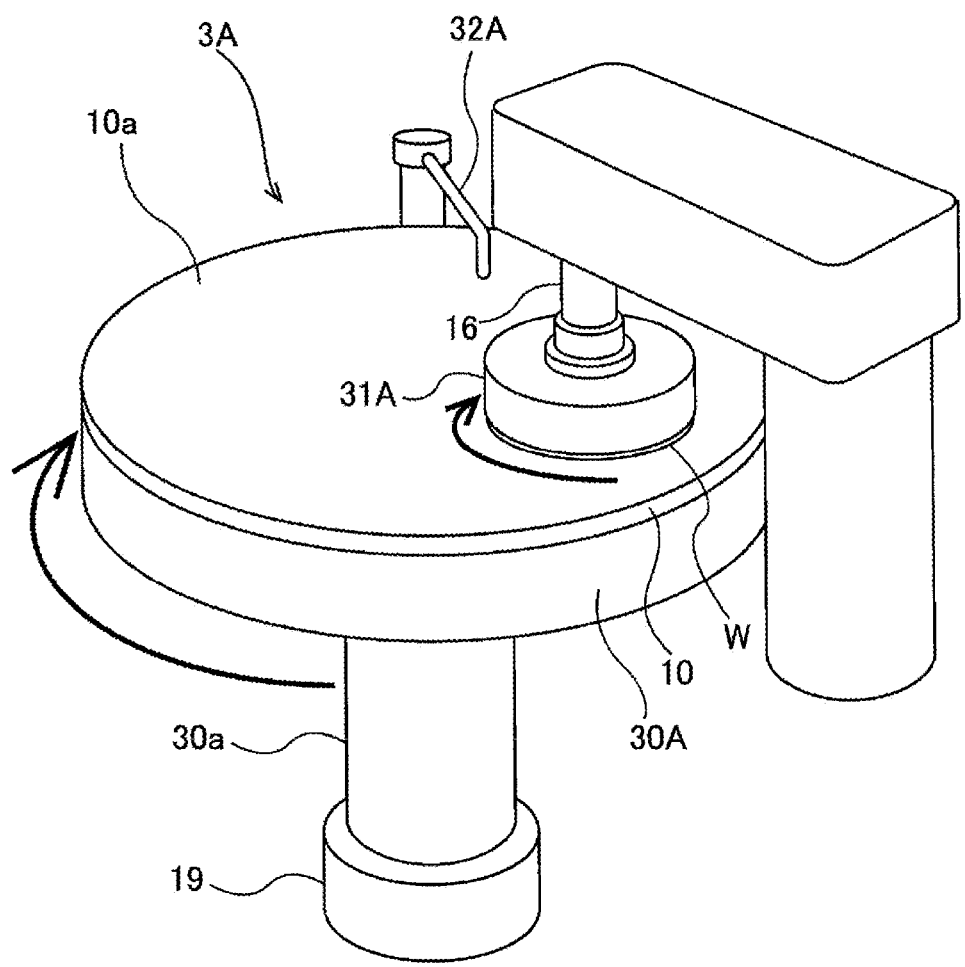
FIG. 2 is a perspective view schematically showing the first polishing unit.

The first polishing unit 3A, the second polishing unit 3B, the third polishing unit 3C, and the fourth polishing unit 3D have the same configuration. Therefore, the first polishing unit 3A will be described below with reference to FIG. 2. FIG. 2 is a perspective view schematically showing the first polishing unit 3A. In FIG. 2, the dresser 33A and the atomizer 34A are omitted.

The polishing table 30A is coupled to a table motor 19 through a table shaft 30a, so that the polishing table 30A is rotated by the table motor 19 in a direction indicated by arrow. The table motor 19 is located below the polishing table 30A. The polishing pad 10 is attached to an upper surface of the polishing table 30A. The polishing pad 10 has an upper surface 10a, which provides a polishing surface for polishing the wafer W. The top ring 31A is coupled to a lower end of a top ring shaft 16. The top ring 31A is configured to hold the wafer W on its lower surface by vacuum suction. The top ring shaft 16 is elevated and lowered by an elevating mechanism (not shown in the drawing).

The wafer W is polished as follows. The top ring 31A and the polishing table 30A are rotated in directions as indicated by arrows, while the polishing liquid (i.e., the slurry) is supplied onto the polishing pad 10 from the polishing liquid supply nozzle 32A. In this state, the top ring 31A presses the wafer W against the polishing surface 10a of the polishing pad 10. The surface of the wafer W is polished by a mechanical action of abrasive particles contained in the polishing liquid and a chemical action of the polishing liquid. After polishing of the wafer W, dressing (or conditioning) of the polishing surface 10a is performed by the dresser 33A (shown in FIG. 1). Further, high-pressure fluid is supplied from the atomizer 34A (shown in FIG. 1) onto the polishing surface 10a to remove polishing debris and the abrasive particles remaining on the polishing surface 10a.

Referring back to FIG. 1, a first linear transporter 6 is arranged adjacent to the first polishing unit 3A and the second polishing unit 3B. This first linear transporter 6 is configured to transport the wafer between four transfer positions (i.e., a first transfer position TP1, a second transfer position TP2, a third transfer position TP3, and a fourth transfer position TP4). A second linear transporter 7 is arranged adjacent to the third polishing unit 3C and the fourth polishing unit 3D. This second linear transporter 7 is configured to transport the wafer between three transfer positions (i.e., a fifth transfer position TP5, a sixth transfer position TP6, and a seventh transfer position TP7).

The wafer is transported to the polishing units 3A and 3B by the first linear transporter 6. The top ring 31A of the first polishing unit 3A is moved between a position above the polishing table 30A and the second transfer position TP2 by the swinging motion of the top ring 31A. Therefore, the transfer of the wafer between the top ring 31A and the first linear transporter 6 is carried out at the second transfer position TP2.

Similarly, the top ring 31B of the second polishing unit 3B is moved between a position above the polishing table 30B and the third transfer position TP3, and the transfer of the wafer between the top ring 31B and the first linear transporter 6 is carried out at the third transfer position TP3. The top ring 31C of the third polishing unit 3C is moved between a position above the polishing table 30C and the sixth transfer position TP6, and the transfer of the wafer between the top ring 31C and the second linear transporter 7 is carried out at the sixth transfer position TP6. The top ring 31D of the fourth polishing unit 3D is moved between a position above the polishing table 30D and the seventh transfer position TP7, and the transfer of the wafer between the top ring 31D and the second linear transporter 7 is carried out at the seventh transfer position TP7.

It is noted that a mechanism of transporting the wafer between the polishing units is not limited to the above-discussed embodiment. For example, in an embodiment, a top ring, while holding a wafer thereon, may move to another polishing unit to transport the wafer directly to another polishing unit. The wafer may be polished by all of the four polishing units 3A, 3B, 3C and 3D, or may be polished by one of the polishing units 3A, 3B, 3C and 3D or plural polishing units (for example, the first polishing unit 3A and the second polishing unit 3B) of the polishing units 3A, 3B, 3C and 3D.

A lifter 11 for receiving the wafer from the transfer robot 22 is provided adjacent to the first transfer position TP1. The wafer is transferred from the transfer robot 22 to the first linear transporter 6 via the lifter 11. A shutter (not shown in the drawing) is provided on the partition 1a at a position between the lifter 11 and the transfer robot 22. When the wafer is to be transported, this shutter is opened to allow the transfer robot 22 to deliver the wafer to the lifter 11.

A swing transporter 12 is provided between the first linear transporter 6, the second linear transporter 7, and the cleaning section 4. Transporting of the wafer from the first linear transporter 6 to the second linear transporter 7 is performed by the swing transporter 12. The wafer is transported to the third polishing unit 3C and/or the fourth polishing unit 3D by the second linear transporter 7.

A buffer stage 72 for the wafer W is disposed beside the swing transporter 12. This buffer stage 72 is mounted to a non-illustrated frame. As shown in FIG. 1, the buffer stage 72 is arranged adjacent to the first linear transporter 6 and located between the first linear transporter 6 and the cleaning section 4. The swing transporter 12 is configured to transport the wafer between the fourth transfer position TP4, the fifth transfer position TP5, and the buffer stage 72.

The wafer W which has been polished at the polishing units 3A and 3B is transported to the fourth transfer position TP4 by the first linear transporter 6. The wafer W is further transported by the swing transporter 12 from the fourth transfer position TP4 to a substrate abnormality detection position (described below) provided above the fifth transfer position TP5, and an abnormality such as a crack of the wafer W is detected at the substrate abnormality detection position. The wafer W which has been polished at the polishing units 3C and 3D is transported to the fifth transfer position TP5 by the second linear transporter 7. The wafer W is further transported to the substrate abnormality detection position provided above the fifth transfer position TP5 by the swing transporter 12, and an abnormality such as a crack of the wafer W is detected at the substrate abnormality detection position.

After abnormality detection is carried out, the wafer is placed on the buffer stage 72 by the swing transporter 12.

The wafer W, placed on the buffer stage 72, is transported to the cleaning section 4 by a first transfer robot 77 of the cleaning section 4. As shown in FIG. 1, the cleaning section 4 includes a first cleaning unit 73 and a second cleaning unit 74 for cleaning the polished wafer with a cleaning liquid and a roll sponge (not shown) and the like, and a drying unit 75 for drying the cleaned wafer. The first transfer robot 77 is configured to transport the wafer from the buffer stage 72 to the first cleaning unit 73 and further transport the wafer from the first cleaning unit 73 to the second cleaning unit 74. A second transfer robot 78 is arranged between the second cleaning unit 74 and the drying unit 75. This second transfer robot 78 is operable to transport the wafer from the second cleaning unit 74 to the drying unit 75.

Figure 3:
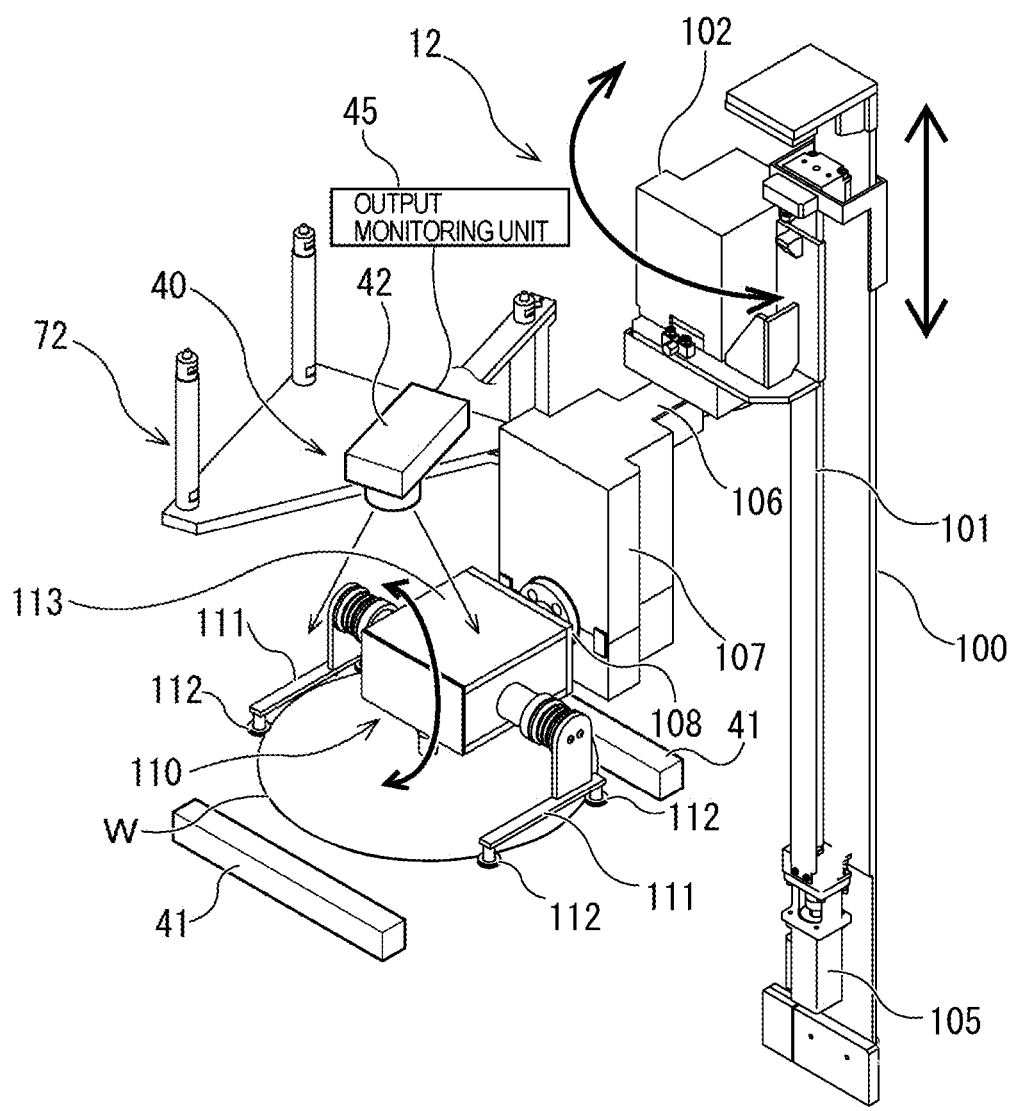
FIG. 3 is a perspective view showing the structure of the swing transporter.

FIG. 3 is a perspective view showing the structure of the swing transporter 12 according to an embodiment. The swing transporter 12 includes a vertically-extending linear guide 101 provided on a frame 100 of the substrate processing apparatus, a swinging mechanism 102 mounted to the linear guide 101, and a lifting/lowering drive mechanism 105 as a driving source for vertically moving the swinging mechanism 102. A Robo cylinder having a servomotor and a ball screw, for example, can be used as the lifting/lowering drive mechanism 105. A reversing mechanism 107 is coupled via a swing arm 106 to the swinging mechanism 102. Further, a gripping mechanism 110 for gripping the wafer W is coupled to the reversing mechanism 107.

By the actuation of a motor (not shown) of the swinging mechanism 102, the swing arm 106 swings about a rotating shaft of the motor, whereby the reversing mechanism 107 and the gripping mechanism 110 swing together, and the gripping mechanism 110 moves between the fourth transfer position TP4, the fifth transfer position TP5 and the buffer stage 72.

The gripping mechanism 110 includes a pair of gripping arms 111 for gripping the wafer W. Both distal ends of each gripping arm 111 have chucks 112 each for gripping the edge of the wafer W (i.e., peripheral portion of the wafer W). The chucks 112 are provided at the both distal ends of each gripping arm 111 so as to project downwardly. The gripping mechanism 110 also includes an opening/closing mechanism 113 for moving the pair of gripping arms 111 away from and closer to the wafer W.

The wafer W is gripped in the following manner. The gripping mechanism 110, with the gripping arms 111 open, is lowered by the lifting/lowering drive mechanism 105 up to a position where the chucks 112 of the gripping arms 111 are flush with the wafer W. The opening/closing mechanism 113 is then driven to move the gripping arms 111 closer to each other, so that the chucks 112 of the gripping arms 111 grip the edge of the wafer W. When the chucks 112 grip the wafer W, a predetermined clearance is formed between each of the chucks 112 and the edge of the wafer W. Specifically, the wafer W is not completely restricted from moving by the chucks 112 but is held in a loose fit manner by grooves (not shown) of the chucks 112. In this state, the gripping arms 111 are lifted by the lifting/lowering drive mechanism 105.

The reversing mechanism 107 has a rotating shaft 108 coupled to the gripping mechanism 110, and a rotary actuator (not shown) for rotating the rotating shaft 108. A fluid-pressure type rotary actuator actuated by a fluid pressure such as an air pressure can be used as the rotary actuator. Instead of the fluid-pressure type rotary actuator, a motor-driven type rotary actuator equipped with a motor for rotating the rotating shaft 108 may be used. By driving the rotating shaft 108 by the rotary actuator, the whole gripping mechanism 110 rotates 180 degrees, thereby reversing the wafer W gripped by the gripping mechanism 110.

The gripping mechanism 110 moves to the buffer stage 72 while gripping the wafer W, and opens the gripping arms 111 to thereby place the wafer W onto the buffer stage 72. The wafer W placed on the buffer stage 72 is transferred by the first transfer robot 77, disposed in the cleaning section 4, to the cleaning section 4. In the substrate processing apparatus according to the present embodiment, the wafer W is transported in the following order: the polishing section 3, the linear transporter 6 and/or the linear transporter 7, the swing transporter 12, the buffer stage 72, and the cleaning section 4.

In the polishing unit 3A shown in FIG. 2, when the polished wafers W are raised from the polishing pad 10 or when the wafers W are released from the top ring 31A at the above-described transfer position, some of the wafers W may be cracked. Thus, as shown in FIG. 3, the substrate processing apparatus according to the present embodiment is equipped with a substrate abnormality detection unit 40 for detecting an abnormality of the wafer such as a crack of the wafer. The substrate abnormality detection unit 40 will be described below.

The present inventors have conceived to detect a crack of a wafer by imaging the wafer with a camera, and have conducted evaluation experiments 1 to 3 shown in FIGS. 4 to 6. In the evaluation experiments 1 to 3, the experiments were performed in a state where a wafer W was gripped in a horizontal attitude by the gripping mechanism 110 of the swing transporter 12. The illustration of the gripping mechanism 110 is omitted in FIGS. 4 to 6. Further, in the evaluation experiments 1 to 3, a bottom surface of an area where the swing transporter 12 was provided in the apparatus shown in FIG. 1 was used as the background (Background) of the images. The background (Background) is schematically shown in a belt-like manner in FIGS. 4 to 6.

FIG. 4A is a schematic view showing a configuration of a substrate abnormality detection unit 40 which has been used in the evaluation experiment 1. As shown in FIG. 4A, the substrate abnormality detection unit 40 includes a light source 41, arranged at an obliquely upward position of the wafer W, for emitting light of an infrared region to the wafer W, and a camera 42, arranged above the wafer W, for imaging the wafer W from above. The light source 41 is configured to emit light having a long wavelength in order to prevent photocorrosion of metal portions such as copper wiring formed on the wafer W in a wavelength region of 400 nm to 1000 nm where spectral sensitivity characteristic of a CMOS element can be obtained. In the experiments, a light source for emitting light having a wavelength of 940 nm is used. The camera 42 comprises a camera with a built-in CMOS sensor.

In the substrate abnormality detection unit 40 configured as shown in FIG. 4A, when light of the infrared region is emitted from the light source 41 to the wafer W, reflected light from the wafer W and diffused reflection light from water droplets on the wafer W enter the camera 42 and are imaged.

FIG. 4B shows an image taken by the camera 42 shown in FIG. 4A. As can be seen from the image shown in FIG. 4B, the wafer is imaged as a black circular image part, and water droplets on the wafer W reflect the light diffusely and are imaged as white dots in the black circular image part. Thus, these white dots become an obstacle to contrast and cause misdetection. It has been found that the wafer immediately after polishing has a polishing liquid attached thereto, and thus the configuration of the evaluation experiment 1 is not preferable.

Figure 5A:
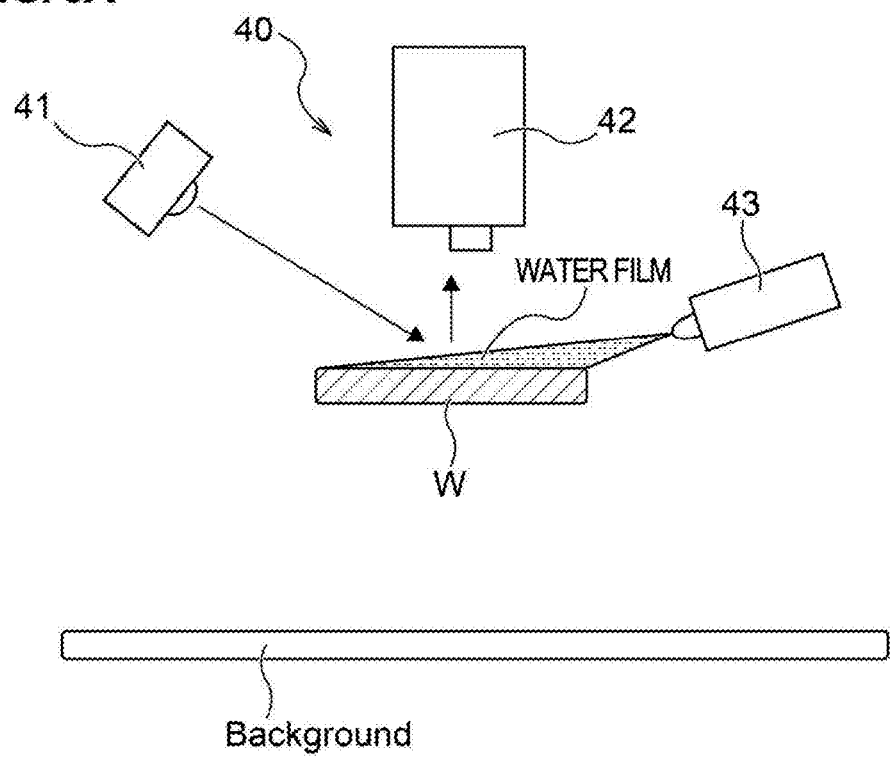
FIG. 5A is a schematic view showing a configuration of a substrate abnormality detection unit which has been used in the evaluation experiment 2.

FIG. 5A is a schematic view showing a configuration of a substrate abnormality detection unit 40 which has been used in the evaluation experiment 2. As shown in FIG. 5A, the substrate abnormality detection unit 40 comprises, in addition to the configuration of the substrate abnormality detection unit 40 shown in FIG. 4A, a nozzle 43 for supplying deionized water (DIW) onto the wafer W to form a water film on the wafer W. With such a configuration, the deionized water (DIW) is supplied from the nozzle 43 onto the wafer W to form the water film on the wafer W, whereby diffuse reflection from the water droplets is prevented. The light source 41 and the camera 42 which have been used in the evaluation experiment 2 shown in FIG. 5A have the same configuration respectively as the light source 41 and the camera 42 which have been used in the evaluation experiment 1 shown in FIG. 4A.

In the substrate abnormality detection unit 40 configured as shown in FIG. 5A, when light of the infrared region is emitted from the light source 41 to the wafer W on which the water film is formed, uniformly reflected light from the entire surface of the water film on the wafer W enters the camera 42 and is imaged.

Figure 5B:
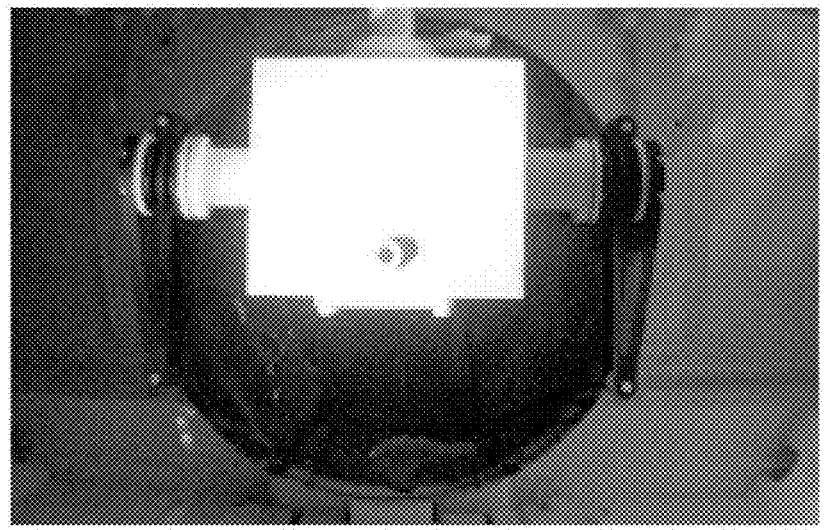
FIG. 5B shows an image taken by a camera shown in FIG. 5A.

FIG. 5B shows an image taken by the camera 42 shown in FIG. 5A. As can be seen from the image shown in FIG. 5B, there is no light that is diffusely reflected from the wafer, and thus the wafer is imaged as a black circular image part. However, because the background is also imaged as a dark image part, the contrast between the image part of the wafer and the image part of the background is not clear. A white rectangular image part in the image is an image part corresponding to the opening/closing mechanism 113 of the gripping mechanism 110 for gripping the wafer. As described above, the contrast between the image part of the wafer and the image part of the background is not necessarily clear. However, it has been found that because there is a slight difference in the brightness of both the image parts, the wafer and the background can be distinguished from each other by the image processing, and thus the crack of the wafer can be detected by using the configuration of the evaluation experiment 2.

Figure 6A:
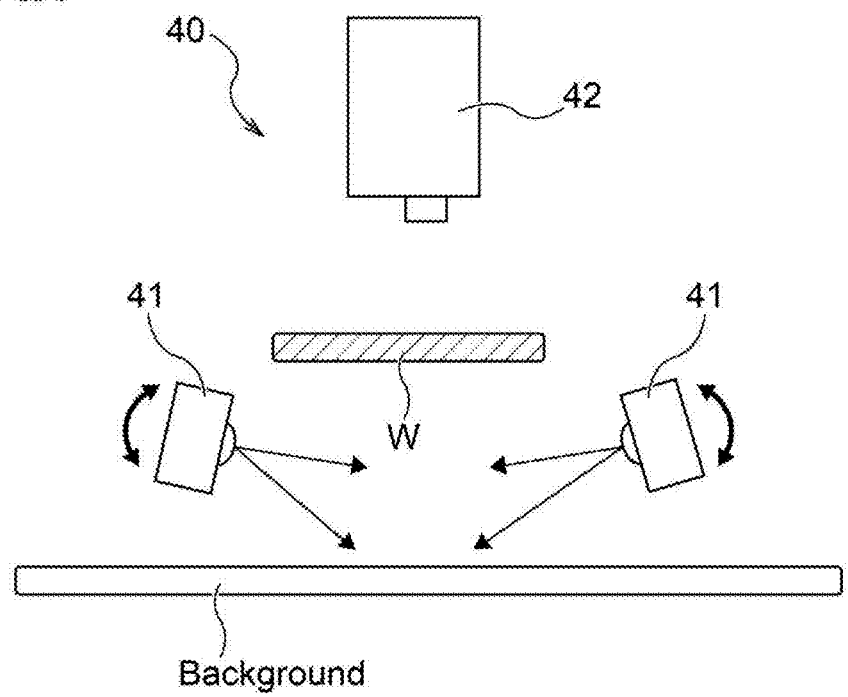
FIG. 6A is a schematic view showing a configuration of a substrate abnormality detection unit which has been used in the evaluation experiment 3.

FIG. 6A is a schematic view showing a configuration of a substrate abnormality detection unit 40 which has been used in the evaluation experiment 3. As shown in FIG. 6A, the substrate abnormality detection unit 40 comprises two light sources 41, 41 arranged below the wafer W and spaced from each other, and a camera 42, arranged above the wafer W, for imaging the wafer W from above. The two light sources 41, 41 are inclined so as to emit light in an obliquely downward direction and configured to illuminate the background. The angles of the light sources 41 can be changed as indicated by arrows. The light source 41 and the camera 42 which have been used in the evaluation experiment 3 shown in FIG. 6A have the same configuration respectively as the light source 41 and the camera 42 which have been used in the evaluation experiment 1 shown in FIG. 4A.

In the substrate abnormality detection unit 40 configured as shown in FIG. 6A, the camera 42 images the wafer W from above in a state where light of the infrared region is applied to the background from the two light sources 41, 41.

Figure 6B:
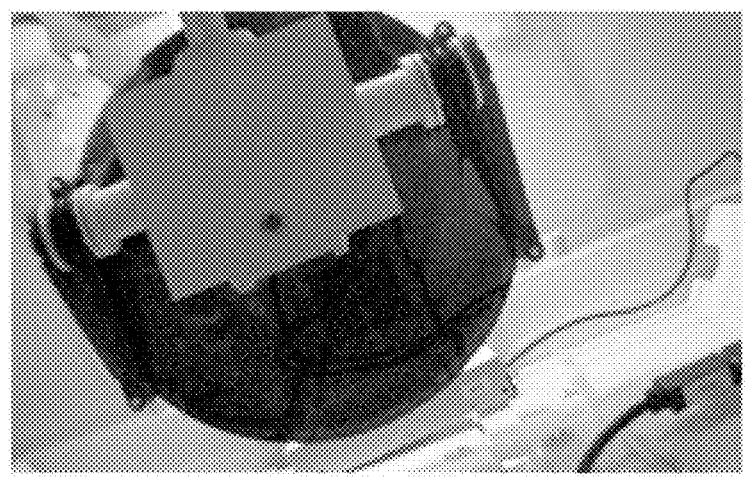
FIG. 6B shows an image taken by a camera shown in FIG. 6A.

FIG. 6B shows an image taken by the camera 42 shown in FIG. 6A. As can be seen from the image shown in FIG. 6B, the wafer is imaged as a black circular image part and the background is imaged as a whitish image part, and thus the contrast between the wafer and the background becomes clear. Therefore, it has been found that the crack of the wafer can be detected accurately by using the configuration of the evaluation experiment 3. A gray rectangular image part in the image is an image part corresponding to the opening/closing mechanism 113 of the gripping mechanism 110 for gripping the wafer.

From the above evaluation experiments 1 to 3, the configuration of the evaluation experiment 3 has produced the clearest contrast between the wafer and the background without any diffuse reflection, and the water film has not been required to be formed, and therefore the configuration of the evaluation experiment 3 has been actually used as the substrate abnormality detection unit 40. Specifically, as shown in FIG. 3, the two light sources 41, 41 are arranged below the wafer W gripped by the gripping mechanism 110, and the camera 42 is arranged above the wafer W. The camera 42 is connected to an output monitoring unit 45. In FIG. 3, the position of the wafer W gripped by the gripping mechanism 110 is the above-described substrate abnormality detection position. The two light sources 41, 41 are elongated rectangular in shape and have a length equal to or longer than the diameter of the wafer W. When the wafer W and the two light sources 41, 41 are viewed from the perpendicular direction, the two light sources 41, 41 are arranged in parallel across the wafer W. The two light sources 41, 41 are inclined so as to emit light in an obliquely downward direction and configured to illuminate the background, so that the two light sources 41, 41 can illuminate the background widely below the wafer. Each of the light sources 41 is configured by arranging a large number of LEDs for emitting light of the infrared region in a horizontal direction. The camera 42 comprises a camera with a built-in CMOS sensor and has an optical axis which is aligned or substantially aligned with the center of the wafer W. Each of the light sources 41 is supported through a supporting member (not shown) by an apparatus frame so that a lighting angle of the light source is variable. Further, the camera 42 is fixed to a ceiling part of the apparatus by an attachment member (not shown).

In the substrate abnormality detection unit 40 configured as described above, when the wafer W is transported to the substrate abnormality detection position (the position shown in FIG. 3) by the swing transporter 12, the operation controller 5 (see FIG. 1) sends an operation signal to the camera 42. When the camera 42 receives the operation signal, the camera 42 sends an ON signal to the light sources 41, 41. Thus, the light sources 41, 41 and the camera 42 are synchronously operated, and the light sources 41, 41 are turned on during a limited time (moment) when the camera 42 is taking an image. The light sources 41, 41 are turned off while the camera 42 is not in operation. In this manner, by limiting the lighting time of the light sources 41, 41 to the minimum necessary, photocorrosion of metal portions such as copper wiring can be prevented. The apparatus may be configured such that the wafer W is imaged by the camera 42 in a state where the wafer W is reversed from the state shown in FIG. 3 and the opening/closing mechanism 113 of the gripping mechanism 110 is positioned below the wafer W.

FIGS. 7A and 7B are views showing a detecting method for detecting a crack of a wafer from an image taken by the camera 42 of the substrate abnormality detection unit 40 configured as shown in FIG. 3. FIG. 7A shows the case of a normal wafer, and FIG. 7B shows the case of a cracked or broken wafer.

As shown in FIGS. 7A and 7B, a plurality of rectangular inspection areas are set along the peripheral portion of a black circular image part corresponding to the wafer. In examples shown in FIGS. 7A and 7B, five rectangular inspection areas are set respectively along the upper peripheral portion and the lower peripheral portion of the black circular image part. Each inspection area is set so as to extend over a black image part corresponding to the wafer and a whitish image part corresponding to the background. Adjacent two inspection areas are set to form an area overlapping each other so that inspection omission does not occur between the adjacent inspection areas.

In the output monitoring unit 45 (see FIG. 3), a threshold which is an area ratio of the black image part corresponding to the wafer and the whitish image part corresponding to the background in each inspection area is preset. The output monitoring unit 45 calculates the area ratio of the black image part corresponding to the wafer and the whitish image part corresponding to the background in each inspection area from the captured image, and compares the calculated area ratio with the preset threshold to determine whether the wafer is cracked or broken. In FIGS. 7A and 7B, the calculated area ratio in each inspection area is represented by a single bar. In each bar in FIGS. 7A and 7B, a white part at the upper side corresponds to the area of the black image part corresponding to the wafer, and a gray part at the lower side corresponds to the area of the whitish image part corresponding to the background. If the wafer is cracked or broken in a certain inspection area, the area of the black image part becomes smaller compared to the area of the whitish image part, and thus the white part at the upper side in the bar becomes shorter and finally becomes shorter than the preset threshold to thereby detect a crack of the wafer. In FIG. 7B, the crack is detected in the second inspection area from the left at the lower side. Since a notch is formed in the wafer, the threshold for detecting a crack is set to a value that can determine the crack when the relevant area is larger than an area of the notch.

Even if the crack of the wafer is detected by the detection method shown in FIGS. 7A and 7B, there is a chance of misdetection, and therefore the swing transporter 12 and the substrate abnormality detection unit 40 perform operations for confirming that misdetection has not occurred.

Figure 8:
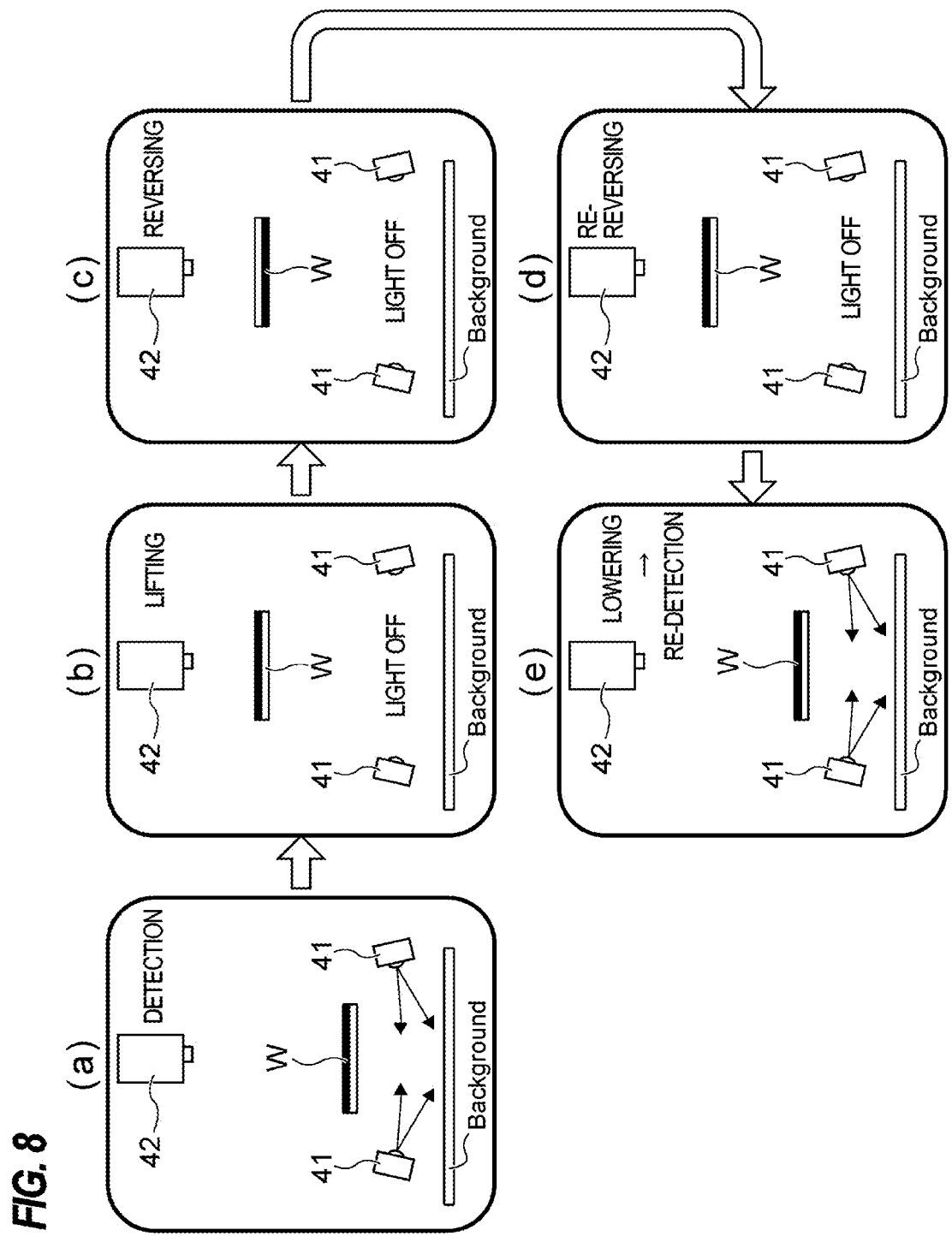
FIG. 8 is a schematic view showing operation steps, performed by the swing transporter and the substrate abnormality detection unit, for confirming that misdetection has not occurred.

FIG. 8 is a schematic view showing operation steps, performed by the swing transporter 12 and the substrate abnormality detection unit 40, for confirming that misdetection has not occurred. In FIG. 8, the wafer W is shown by using white color and black color to distinguish reversing operation of the wafer W.

As shown in FIG. 8(a), the wafer W at the substrate abnormality detection position is imaged by the camera 42 with the light sources turning on, and a crack of the wafer is detected by performing the processing shown in FIGS. 7A and 7B. The light sources 41 are turned on only at the time of imaging. If the crack of the wafer is detected, as shown in FIG. 8(b), the wafer W is lifted by the gripping mechanism 110.

Next, as shown in FIG. 8(c), the wafer W is reversed by the gripping mechanism 110, and then, as shown in FIG. 8(d), the wafer W is reversed again by the gripping mechanism 110. Thereafter, as shown in FIG. 8(e), the wafer W is lowered to the substrate abnormality detection position by the gripping mechanism 110, and then the wafer W is imaged by the camera 42 with the light sources 41 turning on. Then, re-detection of the crack of the wafer is carried out by performing the processing shown in FIGS. 7A and 7B. After repeating the steps of FIGS. 8(a) to 8(e) twice and if the crack of the wafer is detected consecutive three times, it is determined that the crack of the wafer has actually occurred. The number of detection times may be set arbitrarily. In this manner, by performing the operation steps by the swing transporter 12 and the substrate abnormality detection unit 40 to confirm that misdetection has not occurred, the misdetection caused by the displacement of the wafer W due to the clearance between each of the chucks 112 for gripping the wafer W and the wafer W can be prevented from occurring.

Next, the relationship between the substrate abnormality detection unit 40 and each unit of the substrate processing apparatus will be described. The wafer is likely to be cracked or broken in the polishing units 3A to 3D. If the cracked or broken wafer (i.e., partially damaged wafer) is cleaned in the cleaning section 4, the wafer may be broken into pieces. Thus, it is preferable to detect the cracked or broken wafer before the wafer is transported to the cleaning section 4. For that reason, the wafer W is transported in the order of the polishing unit 3A (and 3B to 3D), the substrate abnormality detection unit 40, and the cleaning units 73, 74. In the present embodiment, the substrate transporting mechanism for transporting the wafer W in the above order comprises the first linear transporter 6 (and the second linear transporter 7), the swing transporter 12, and the first transfer robot 77. The substrate abnormality detection unit 40 is arranged between the polishing units 3A to 3D and the cleaning units 73, 74.

Although the substrate abnormality detection unit 40 is arranged above the fifth transfer position TP5 in the present embodiment, the substrate abnormality detection unit 40 may be arranged in other locations. For instance, the substrate abnormality detection unit 40 may be arranged above the buffer stage 72 or the first linear transporter 6.

In the case where the substrate abnormality detection unit 40 detects the cracked or broken wafer, the operation controller 5 stops the operation of the polishing units 3A to 3D and the substrate transporting mechanism (the first linear transporter 6, the second linear transporter 7, the swing transporter 12, and the first transfer robot 77). The cracked or broken wafer is removed from the substrate processing apparatus by the operator, and thus the cracked or broken wafer is prevented from being transported to the cleaning section 4. After the wafer is removed from the substrate processing apparatus, the operation of the substrate processing apparatus is resumed.

In the case where the substrate abnormality detection unit 40 detects the cracked or broken wafer, the swing transporter 12 may place the cracked or broken wafer on the buffer stage 72 shown in FIG. 1, and thereafter the operation controller 5 may stop the operation of the polishing units 3A to 3D and the substrate transporting mechanism. Further, a second buffer stage (not shown) for temporarily placing the wafer thereon may be provided separately from the buffer stage 72 serving as a first buffer stage. In this case, after the cracked or broken wafer is placed on the second buffer stage, the operation controller 5 may stop the operation of the polishing units 3A to 3D and the substrate transporting mechanism. After the cracked or broken wafer is placed on the second buffer stage, the operation of the polishing units 3A to 3D and the substrate transporting mechanism may be continued without any change. The second buffer stage can be arranged, for example, above or below the first cleaning unit 73 or the second cleaning unit 74 disposed in the cleaning section 4.

As shown in FIG. 1, in the substrate processing apparatus according to the embodiment, a monitoring camera 50 is provided in the vicinity of the polishing table 30A to enable the monitoring of the state when the polished wafer W is raised from the polishing pad 10. Further, a monitoring camera 51 is provided at a wafer release position to enable the monitoring of the state when the wafer W is released from the top ring 31A. Other monitoring cameras are provided also in the vicinity of other polishing tables or at other wafer release positions, but illustration of them is omitted. In this manner, because the monitoring cameras 50, 51 are provided, when the substrate abnormality detection unit 40, provided at the location of the swing transporter 12, detects the cracked or broken wafer, the transferring situation of the wafer from a predetermined time before the time of detection onward, e.g., from 1 minute before the time of detection onward, can be replayed by the monitoring cameras 50, 51 according to the detection signal from the substrate abnormality detection unit 40. Therefore, the moment the wafer was cracked or broken can be grasped, and thus measures to prevent the wafer from being cracked or broken can be taken.

Although the embodiments have been described above, it should be understood that the present invention is not limited to the above embodiments, and various changes and modifications may be made without departing from the technical concept of the appended claims, the specification, and the drawings.

What is claimed is:

1. A substrate processing apparatus comprising:
a polishing unit configured to polish a substrate;
a cleaning unit configured to clean the polished substrate;
a substrate abnormality detection unit configured to detect an abnormality of the substrate; and
a substrate transporting mechanism configured to transport the substrate in the order of the polishing unit, the substrate abnormality detection unit, and the cleaning unit;
the substrate abnormality detection unit comprising:
a light source arranged below the substrate and configured to emit light;
an imaging device arranged above the substrate and configured to image the substrate; and
an output monitoring unit configured to determine a status of the substrate by comparing a signal obtained from the imaging device with a predetermined threshold;
wherein the substrate is located between the imaging device and the light source, and the light source is configured to emit the light to an area of a background, the background being on an opposite side of the substrate from a surface of the substrate imaged by the imaging device; and
wherein the light source has a surface for emitting the light, the surface facing downward so as to direct the light toward the background located below the substrate.

2. The substrate processing apparatus according to claim 1,
wherein the signal obtained from the imaging device comprises a signal obtained from each of a plurality of areas, each of the plurality of areas including a part corresponding to the substrate and a part corresponding a background; and
the output monitoring unit determines the abnormality of the substrate when the signal obtained from at least one of the plurality of areas falls outside the threshold.

3. The substrate processing apparatus according to claim 1, wherein the imaging device comprises a camera with a built-in CMOS sensor.

4. The substrate processing apparatus according to claim 1,
wherein the substrate transporting mechanism comprises a moving mechanism configured to move the substrate;
when the abnormality of the substrate is detected by the output monitoring unit of the substrate abnormality detection unit, a predetermined operation of the moving mechanism and re-detection operation of the substrate abnormality detection unit are performed at least one time; and
the abnormality of the substrate is determined when the abnormality of the substrate is detected consecutively by the re-detection operation.

5. The substrate processing apparatus according to claim 4, wherein the moving mechanism comprises chucks configured to support a peripheral portion of the substrate, and moves the chucks and the substrate in a state where a predetermined clearance is formed between each of the chucks and the peripheral portion of the substrate.

6. The substrate processing apparatus according to claim 4, wherein the predetermined operation of the moving mechanism comprises lifting/lowering, and one of reversing, rotation about a horizontal axis and rotation about a vertical axis.

7. The substrate processing apparatus according to claim 1, wherein the light source comprises a light source configured to emit light of an infrared region.

8. The substrate processing apparatus according to claim 1, wherein the light source is turned on during a limited time of imaging by the imaging device.

9. The substrate processing apparatus according to claim 1, wherein a liquid film is formed on a surface of the substrate immediately before the imaging of the substrate.

10. The substrate processing apparatus according to claim 1, wherein the abnormality of the substrate is a crack of the substrate.

11. The substrate processing apparatus according to claim 1, wherein the imaging device has an optical axis which is aligned or substantially aligned with the center of the substrate.

12. The substrate processing apparatus according to claim 1, wherein the light source is elongated rectangular in shape and has a length equal to or longer than a diameter of the substrate.

13. The substrate processing apparatus according to claim 1, wherein the light source comprises a pair of light sources, and the pair of light sources are arranged in parallel across the substrate when the substrate and the pair of light sources are viewed from a perpendicular direction.

14. A substrate processing apparatus comprising:
a processing unit configured to process a substrate;
a substrate transporting mechanism configured to transport the substrate; and
a substrate abnormality detection unit configured to detect an abnormality of the substrate;
the substrate abnormality detection unit comprising:
a light source arranged below the substrate and configured to emit light;
an imaging device arranged above the substrate and configured to image the substrate; and
an output monitoring unit configured to determine a status of the substrate by comparing a signal obtained from the imaging device with a predetermined threshold;
wherein the substrate is located between the imaging device and the light source, and the light source is configured to emit the light to an area of a background, the background being on an opposite side of the substrate from a surface of the substrate imaged by the imaging device; and wherein the light source has a surface for emitting the light, the surface facing downward so as to direct the light toward the background located below the substrate.

15. The substrate processing apparatus according to claim 14, wherein the signal obtained from the imaging device comprises a signal obtained from each of a plurality of areas, each of the plurality of areas including a part corresponding to the substrate and a part corresponding a background; and the output monitoring unit determines the abnormality of the substrate when the signal obtained from at least one of the plurality of areas falls outside the threshold.

16. The substrate processing apparatus according to claim 14, wherein the imaging device comprises a camera with a built-in CMOS sensor.

17. The substrate processing apparatus according to claim 14, wherein the substrate transporting mechanism comprises a moving mechanism configured to move the substrate;

when the abnormality of the substrate is detected by the output monitoring unit of the substrate abnormality detection unit, a predetermined operation of the moving mechanism and re-detection operation of the substrate abnormality detection unit are performed at least one time; and the abnormality of the substrate is determined when the abnormality of the substrate is detected consecutively by the re-detection operation.

18. The substrate processing apparatus according to claim 14, wherein the abnormality of the substrate is a crack of the substrate.

* * * * *